(12) United States Patent
Shum et al.

(10) Patent No.: US 11,119,917 B2
(45) Date of Patent: Sep. 14, 2021

(54) NEUROMORPHIC MEMORIES WITH SPLIT GATE FLASH MULTI-LEVEL CELL AND METHOD OF MAKING THE SAME

(71) Applicant: GLOBALFOUNDRIES Singapore Pte. Ltd., Singapore (SG)

(72) Inventors: Danny Pak-Chum Shum, Caspian (SG); Shyue Seng Tan, Singapore (SG); Xinshu Cai, Singapore (SG); Fan Zhang, Singapore (SG); Soh Yun Siah, Singapore (SG); Tze Ho Simon Chan, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 271 days.

(21) Appl. No.: 16/034,069

(22) Filed: Jul. 12, 2018

(65) Prior Publication Data

US 2020/0019500 A1 Jan. 16, 2020

(51) Int. Cl.
*G06F 12/08* (2016.01)
*G11C 16/10* (2006.01)
*G06N 5/04* (2006.01)
*G06N 3/08* (2006.01)
*G06N 3/063* (2006.01)
*G06F 30/327* (2020.01)

(52) U.S. Cl.
CPC ............ *G06F 12/08* (2013.01); *G06F 30/327* (2020.01); *G06N 3/063* (2013.01); *G06N 3/08* (2013.01); *G06N 5/046* (2013.01); *G11C 16/107* (2013.01); *G06F 2212/2022* (2013.01)

(58) Field of Classification Search
CPC .................. G06F 12/08; G06F 30/327; G06F 2212/2022; G06N 5/046; G06N 3/08; G06N 3/063; G11C 16/107; G11C 11/5628; G11C 11/5642; G11C 16/0425; G11C 11/54
See application file for complete search history.

(56) References Cited

U.S. PATENT DOCUMENTS

| | | | |
|---|---|---|---|
| 6,628,544 B2 | 9/2003 | Shum et al. | |
| 2007/0108495 A1* | 5/2007 | Wu | H01L 29/792 257/314 |
| 2008/0303067 A1* | 12/2008 | Rao | H01L 29/40114 257/288 |
| 2016/0336064 A1* | 11/2016 | Seo | G06N 3/088 |
| 2017/0194446 A1* | 7/2017 | Lee | H01L 29/7827 |
| 2018/0018559 A1* | 1/2018 | Yakopcic | G11C 13/004 |

(Continued)

OTHER PUBLICATIONS

Atwood et al., edited by Lin Chao, "Intel StrataFlash™ Memory Technology Overview", published in Intel Technology Journal Q4, 1997, 9 pages.

(Continued)

*Primary Examiner* — Ajay Ojha
(74) *Attorney, Agent, or Firm* — Ditthavong, Steiner & Mlotkowski

(57) ABSTRACT

The present disclosure relates to split gate flash MLC based neuromorphic processing and method of making the same. Embodiments include MLC split-gate flash memory formed over a substrate, the MLC split-gate flash memory embedded with artificial neuromorphic processing to dynamically program and erase each cell of the MLC split-gate flash memory; and sense visual imagery by the artificial neuromorphic processing.

18 Claims, 7 Drawing Sheets

(56) References Cited

U.S. PATENT DOCUMENTS

2019/0013415 A1* 1/2019 Bhattacharyya .... H01L 29/7923
2019/0019564 A1* 1/2019 Li ..................... G11C 11/5628
2019/0312045 A1* 10/2019 Bo .................... H01L 21/76877

OTHER PUBLICATIONS

Fazio et al., "Intel StrataFlash™ Memory Technology Development and Implementation", published in Intel Technology Journal Q4, 1997, 13 pages.
Ramada, "Redundancy Yield Model for SRAMS", published in Intel Technology Journal Q4, 1997, 8 pages.
Hampson et al., "Redundancy and High-Volume Manufacturing Methods", published in Intel Technology Journal Q4, 1997, 5 pages.
Alavi et al., "A PROM Element Based on Salicide Agglomeration of Poly Fuses in a CMOS Logic Process", published in IEEE International Electron Devices Meeting, Dec. 1997, 4 pages.

* cited by examiner

NEUROMORPHIC MEMORIES WITH SPLIT GATE FLASH MULTI-LEVEL CELL AND METHOD OF MAKING THE SAME

TECHNICAL FIELD

The present disclosure relates to machine learning with multi-level cell (MLC) memory. In particular, the present disclosure relates to split gate flash MLC based neuromorphic processing.

BACKGROUND

A concern in manufacturing of semiconductor memory is density. Manufacturing costs of a memory device is related to the amount of area used in storing a bit of information on a semiconductor chip. Costs can be reduced by scaling feature size to place more transistors on a substrate and to achieve a higher density. Another cost-saving technique that stores more data in a given device is MLC technology. MLC technology further increases cell density by increasing the number of possible states associated with a memory cell. MLC technology allows a memory cell to store information corresponding to more than one bit or more than two states per bit. Flash memory cells are produced at relatively low cost and erasing information stored in a flash memory array is simplified. MLC flash memory with its multiple voltage states decreases manufacturing costs and as a result its usage in a variety of technologies including USB flash drives, cellphones, digital cameras, etc. has increased.

Self-aligned split gate flash cell integrated in a logic process of integrated circuits is erased via poly-to-poly Fowler-Norheim (FN) tunneling across a filed-enhanced asymmetric tunneling barrier formed between a floating gate (FG) and an erase gate (EG). Flash memory operating with FN tunneling for erase mechanisms can involve floating gate-to-channel, floating gate-to-drain or floating gate-to-source as the charge clearing path from the floating gate. The programming mechanisms of these flash memory devices can include charge carrier paths between the floating gate and drain or alternatively between the floating gate and source via hot carrier injection or FN tunneling.

A neural network (NN) is a system of hardware and/or software patterned after the operation of neurons in the human brain. The NN system is an artificial neural network used for a variety of machine learning technologies. Some applications of machine learning use convolutional neural networks, wherein the nodes of each layer are clustered, the clusters overlap, and each cluster feeds data to multiple nodes of the next layer. A computer in a NN system learns to perform a task by analyzing and classifying training examples. An object recognition system, for example, is provided with labeled images of faces, animals, cars, houses, cups, etc., and it would find visual patterns in the images that match with particular labels.

A need exists for improved methodology enabling classification with split gate flash MLC based neuromorphic processing and the resulting device.

SUMMARY

An aspect of the present disclosure is providing neuromorphic memory with split gate flash MLC. Another aspect of the present disclosure is to provide machine learning capability in a NN system with its hardware configured to accelerate training of the NN and to perform as a classifier using trained model approach to predict. The classification capability is achieved with memory embedded processing.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: MLC split-gate flash memory formed over a substrate, the MLC split-gate flash memory embedded with artificial neuromorphic processing to dynamically program and erase each cell of the MLC split-gate flash memory; and sense visual imagery by the artificial neuromorphic processing.

Aspects of the present disclosure include the MLC split-gate flash memory including persistent memory on-chip. Other aspects include the MLC split-gate flash memory further including MLC multiple states/bit within a pre-defined margin window. Additional aspects include artificial neuromorphic processing being further configured to classify the visual imagery with analog memory and adder circuitry. Yet another aspect includes the MLC split-gate flash memory being split into two bits per cells or four logical states of a same cell footprint. Other aspects include the MLC split-gate flash memory being split into three bits per cells or eight logical states ($2^3$) of a same cell footprint. Yet another aspect includes the MLC split-gate flash memory being split into four bits per cells or sixteen logical states ($2^4$) of a same cell footprint.

Another aspect of the present disclosure is to provide a method including forming MLC split-gate flash memory over a substrate, the MLC split-gate flash memory embedded with artificial neuromorphic processing; dynamically programming and erasing each cell of the MLC split-gate flash memory; and sensing visual imagery by the artificial neuromorphic processing.

Aspects include the MLC split-gate flash memory including persistent memory on-chip. Other aspects include forming the MLC split-gate flash memory with multiple bits/states within a predefined margin window. Additional aspects include the artificial neuromorphic processing being further configured to classify the visual imagery with analog memory and adder circuitry. Yet other aspects include forming the MLC split-gate flash memory by forming the MLC split-gate flash memory with two bits per cells or four logical states of a same cell footprint. Further aspects include forming the MLC split-gate flash memory by forming the MLC split-gate flash memory with three bits per cells or eight logical states of a same cell footprint. Yet another aspect includes forming the MLC split-gate flash memory by forming the MLC split-gate flash memory with four bits per cells or sixteen logical states of a same cell footprint. Additional aspects include wherein the embedded artificial neuromorphic processing comprises a convolutional NN for sensing and classifying the visual imagery.

In yet a further aspect, there is provided a method including forming MLC split-gate flash memory over a substrate, the MLC split-gate flash memory including multiple bits/states within a predefined margin window and is embedded with artificial neuromorphic processing. Each cell of the MLC split-gate flash memory is configured for dynamic programming and erasing. Visual imagery is sensed by the artificial neuromorphic processing. The visual imagery is classified with analog memory and adder circuitry.

Aspects include forming the MLC split-gate flash memory by forming the MLC split-gate flash memory with two bits per cells or four logical states of a same cell footprint. Other aspects include forming the MLC split-gate flash memory by forming the MLC split-gate flash memory with three bits per cells or eight logical states of a same cell footprint. Yet other aspects include forming the MLC split-gate flash memory by forming the MLC split-gate flash memory with four bits per cells or sixteen logical states of a same cell footprint. Additional aspects include the embedded artificial neuromorphic processing including a convolutional NN for sensing and classifying the visual imagery.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of insufficient training and classification of NN systems with existing computing systems. In accordance with embodiments of the present disclosure, a device and related method are provided that include MLC split-gate flash memory formed over a substrate, the MLC split-gate flash memory being embedded with artificial neuromorphic processing to dynamically program and erase each cell of the MLC split-gate flash memory; and sense visual imagery by the artificial neuromorphic processing.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
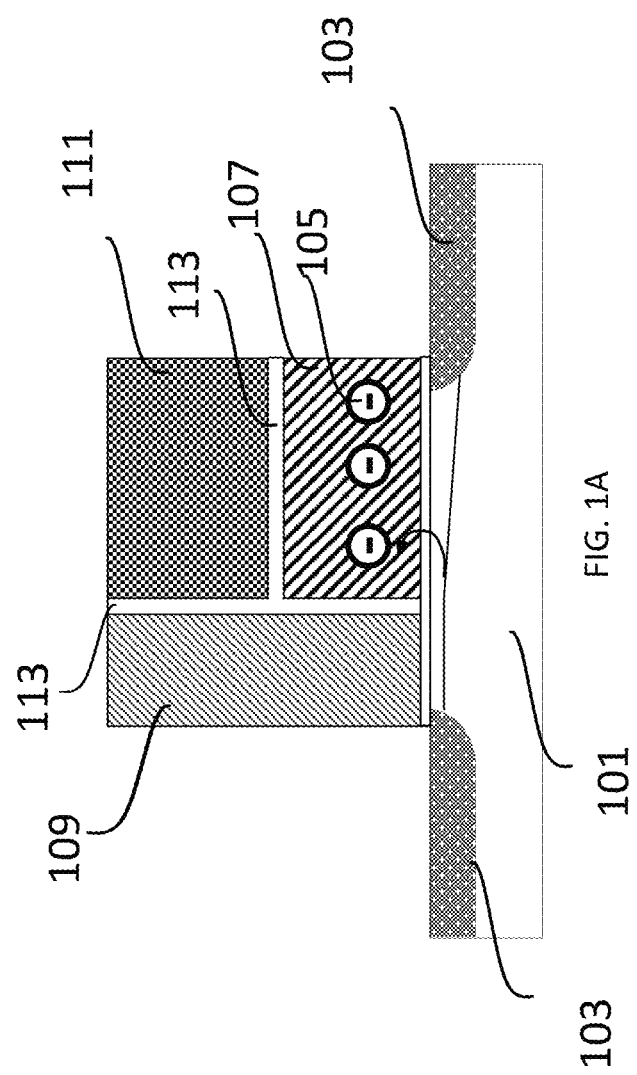
FIGS. 1A and 1B schematically illustrate in cross-sectional view, split gate memory cells configured with neuromorphic processing, in accordance with an exemplary embodiment.
Figure 1B:
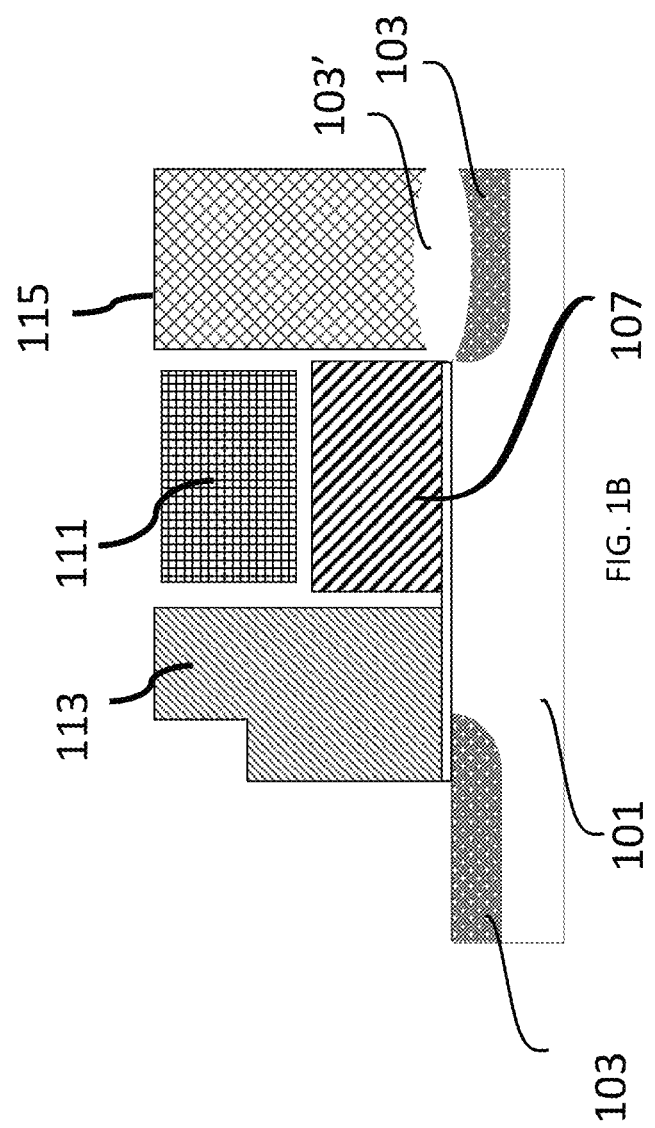

Embodiments of the present disclosure include a device comprising multi-level cell (MLC) split-gate flash memory formed over a substrate. FIG. 1A is an example of a split gate flash memory cell formed over a substrate 101. Source/drain (S/D) region 103 is formed in the substrate 101 by dopant implantation. In this example, source side injection (SSI) is provided such that hot electrons 105 from the current of S/D region 103 is injected into the FG poly 107 at the gap between the SG 109 and the FG 107. CG 111 is formed over the FG 107. An oxide layer 113 is formed between the SG 109 and the CG 111 and FG 107. The split gate flash memory cell can be a non-self aligned cell, a self-aligned cell or self-aligned top coupling cell. The memory cell includes power on reset (POR) bias with a control gate voltage (Vcg) of 10 to 11V; select gate voltage (Vsg)=Vdd which can be core voltage 1.1V or IO voltage of 1.8V, source voltage 4 to 5V, and drain voltage of about 0.5V. Efficiency of the memory cell is in the range of $10^{-4}$ to $10^{-5}$ (e.g. 1 electron injected per every 10,000 to 100,000 electrons available in the channel region). Typical power consumption is under 10 microamps (µA) per cell at 10 microseconds (µs). SSI injection, self regulate by channel current or drain back bias can be used. FIG. 1B is another example of a split gate flash memory cell formed over a substrate 101 with an additional erase gate (EG) 115. CG 111 is disposed over FG 107. Word line gate (WL) 113 is disposed over a portion of the drain region of the S/D region 103 and the erase gate (EG) 115 is disposed over a portion of the source region of the S/D region 103. The oxidation enhanced diffusion of the source region 103 results in oxide region 103'. FG 107 is self-aligned to both an active gate and control gate 111. The WL 113 and EG 115 are formed by way of logic polysilicon deposition. S/D region 103 is formed by way of CMOS logic processing. The erase operation uses poly-to-poly tunneling with the field enhancing poly injector. The program operation uses SSI and the read operation is performed with low voltage Vcc.

Figure 3:
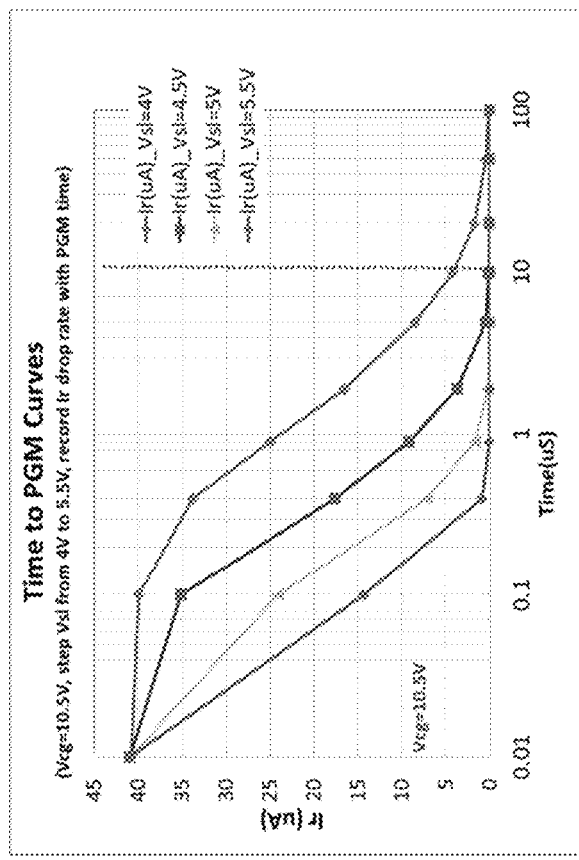
FIGS. 2, 3 and 4 illustrate programming time curve charts, in accordance with an exemplary embodiment.
Figure 2:
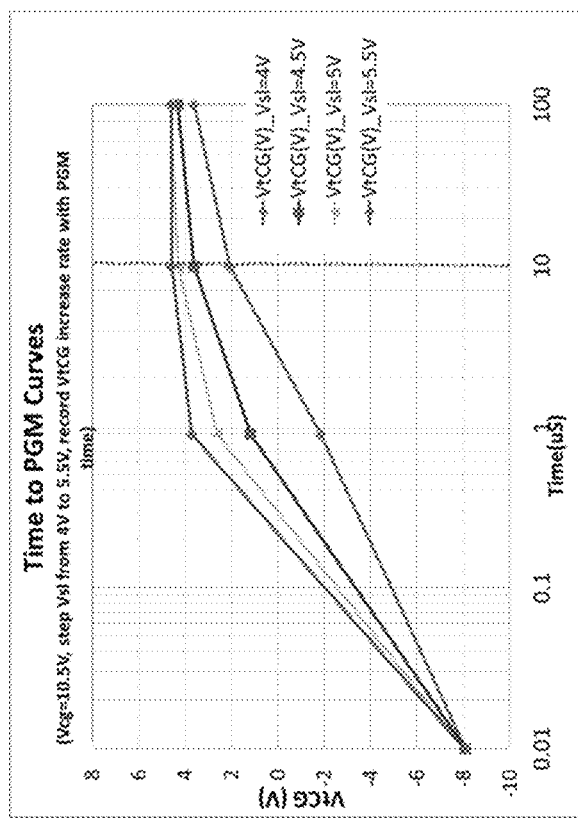

FIGS. 2 and 3 illustrate cell voltage threshold (Vt) time to programming curves (back bias drain voltage Vd). The Vt is the threshold voltage when the device is "on" and is read from the CG in volts (Vcg) with drain or bitline voltage in the range of 0.6 to 1V. In FIG. 2 of the programming time curve, the Vcg bias at 10.5V, with a step source line voltage (Vsl) from 4V to 5.5V and the VtCG is recorded with an increased rate over programming (PGM) time in µs. FIG. 3 is substantially the same data as FIG. 2, but instead of measured Vt of the device, it reads the drain current Ir of the device and the Ir (µA) is recorded with a drop rate over programming (PGM) time in Flash memory cell read high level of drain current typically in 30 to 40 µA when cell Vt is low and very low level of drain current typically in nA range when cell Vt is high at VBL voltage of 0.8 to 1V.

With a 2-bit/split-gate cell the Vt achieved saturation for a fix source line voltage-drain voltage (Vsl-Vd) is as follows with four states: "00"≥+5V (Vsl 5.5V, Vd ground (gnd); "01" +1V (reduced Vsl-Vd); "10" −3V (reduced Vsl-Vd); and "11"<−10V (deep erase). The other three levels of the 2-bit/split-gate cell are configured to spread from −V to +V to provide more margin separation. The deep erase is achieved with regulation.

With a 3-bit/split-gate cell the Vt achieved saturation for a fix source line voltage-drain voltage (Vsl-Vd) as follows for eight states: "000"≥7V (Vsl 5.5V, Vd gnd); "001" 6-7V (reduced Vsl-Vd); "010" 4.5-5.5V (reduced Vsl-Vd); "100" 3-4V (reduced Vsl-Vd); "011" 1.5-2.5V (reduced Vsl-Vd); "101" 0-1V (reduced Vsl-Vd); "110" −3 to 0V (reduced Vsl-Vd); and "111"<−10V (deep erase).

Figure 4:
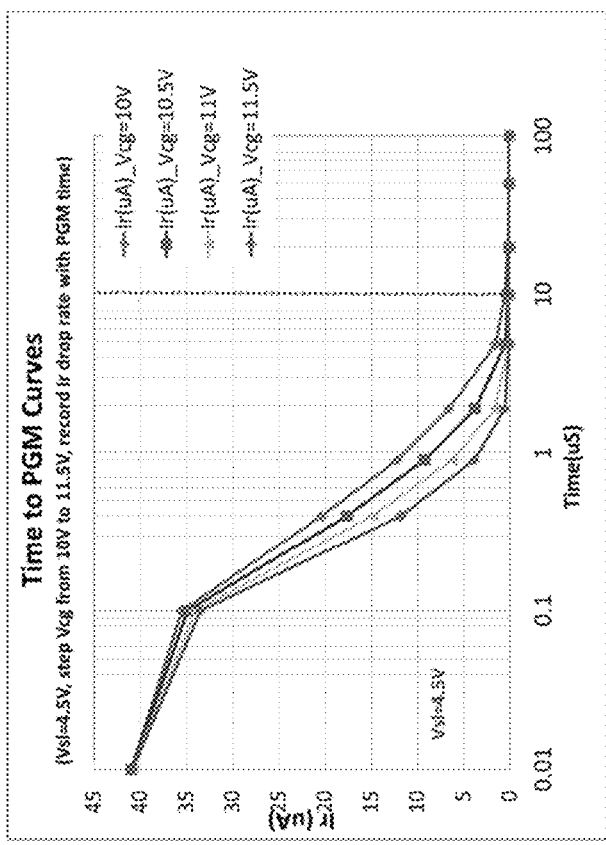
Figure 5:
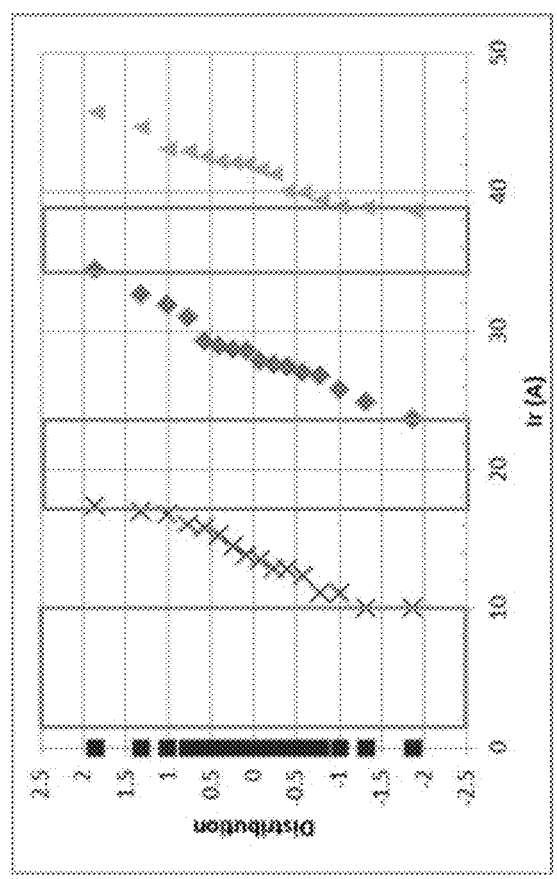

FIG. 4 illustrates cell read current (Ir) time to programming curves similar to FIG. 3, but as a result of limiting Vcg. The Vsl equals 4.5V, with a step Vcg from 10V to 11.5V and the Ir (µA) is recorded with a drop rate over programming (PGM) time in µs. The chart in FIG. 5 illustrates a memory array distribution (number of sigma on the y-axis) relative to Ir (µA). Ir achieved saturation for a fix Vcg for a 2-bit/split-gate cell as follows: "00" achieved <µA (Vcg 11.5V); "01" 13 µA (reduced Vcg); "10" 30 µA (reduced Vcg); and "11">40 µA (deep erased). With a 3-bit/split-gate cell Ir achieved saturation for a fix Vcg as follows with eight states: "000" achieved <µA; "001" 4-8 µA (reduced Vsl-Vd); "010" 13-17 µA (reduced Vsl-Vd); "100" 22-26 µA (reduced Vsl-Vd); "011" 30-34 µA (reduced Vsl-Vd); "101" 38-42 µA (reduced Vsl-Vd); "110" 46 to 50 µA (reduced Vsl-Vd); and "111">50 µA (deep erase).

Figure 6:
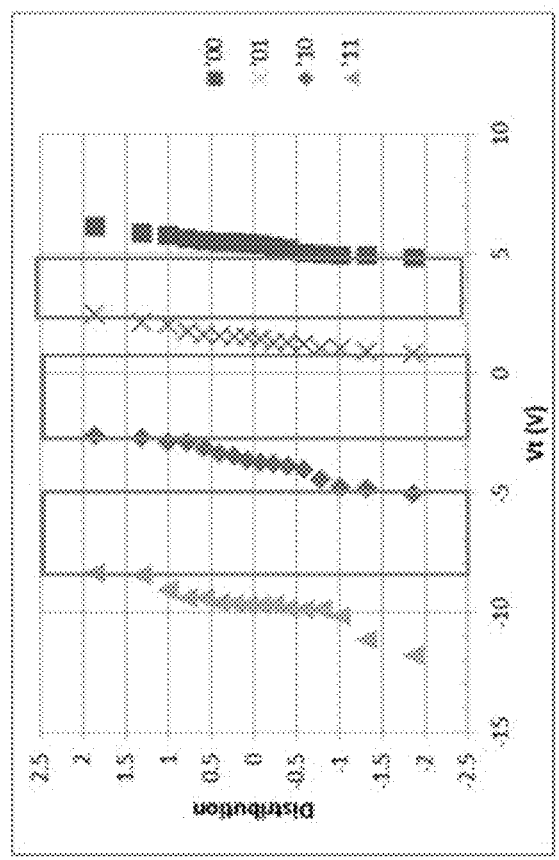
FIGS. 5 and 6 illustrate distribution charts as a result of limiting control gate voltage, in accordance with an exemplary embodiment.

FIG. 6 is a chart illustrating a memory array distribution (number of sigma on the y-axis) relative to Vt (V) for a 2-bit/split-gate cell. Vt achieved saturation for a fix Vsl-Vd for 4 states as follows: "00" achieved +5V (Vsl 5.5V, Vd gnd); "01" +1V (reduced Vsl-Vd); "10"-3V (reduced Vsl-Vd); and "11"<−10V (deep erase). This can be similarly extended to a 3-bit/split-gate cell with eight states/8 levels.

The MLC split-gate flash memory cell is embedded with artificial neuromorphic processing to dynamically program and erase each cell of the MLC split-gate flash memory. The MLC split-gate flash memory includes persistent memory on-chip technology. The MLC split-gate flash memory includes MLC multiple bits/states within a predefined margin window. The MLC split-gate flash memory is split into two, three, four bits, etc. per cell with four, eight and sixteen logical states of a same cell footprint, respectively.

Figure 7:
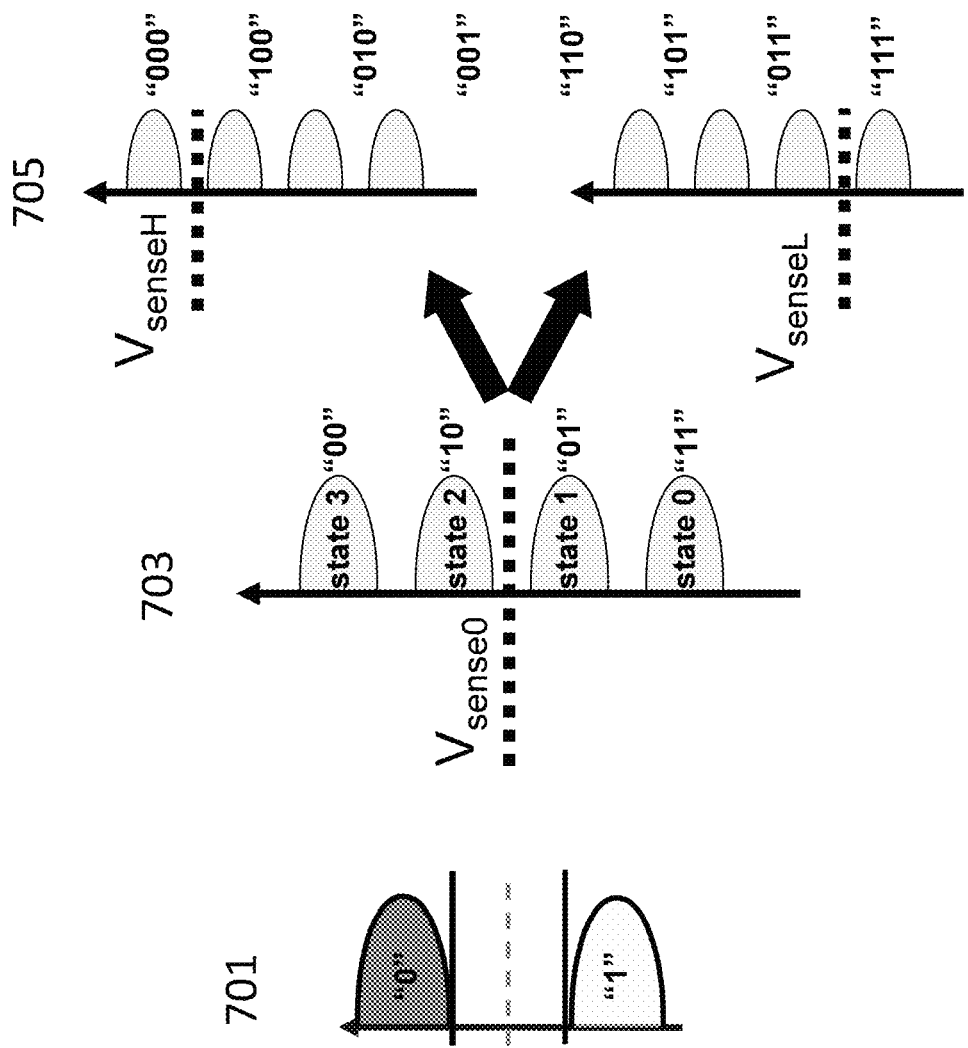
FIG. 7 illustrates a diagram of a MLC with different logical states in accordance with an exemplary embodiment.

FIG. 7 illustrates a diagram of a MLC with two logical states "0" and "1" (701), four logical states "00", "10", "01" and "11" (703), and eight logical states "000", "100", "010", "001", "110", "101", "011" and "111" (705). Each Vsense0 represents one logical state, VsenseH represents fully programmed, and VsenseL represents fully erased.

Figure 8:
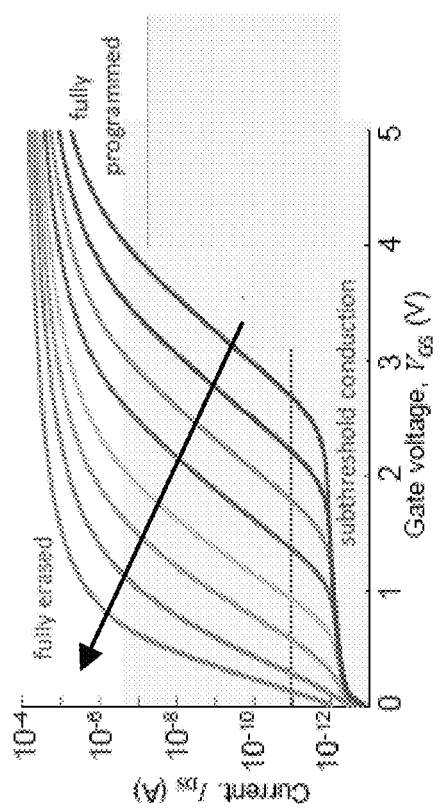
FIG. 8 illustrates analog multilevel states obtained using control gate voltages of +5V to +12V in increment of 1V sweeps (FIG. 4) for gradual discrete type of switching of Vt (or Ids), in accordance with an exemplary embodiment.

FIG. 8 illustrates analog multilevel states for the gradual discrete type of switching of Vt (or Ids) by program voltage pulse amplitude or pulse width as in FIG. 4, the MLC SG-cell of FIG. 1A or 1B, for example, can convert digital input signal at CG 111 to analog potential (threshold Vt or drain current Ir). As represented in FIG. 8, gradual discrete type of switching of Vt (or Ids) results in analog tuning of conductivity, thus exhibits analog memory element characteristics with multiple current (or voltage) states, with accuracy over time (good endurance) and temperature (good retention).

Thus the MLC SG-cell is used as an analog memory to allow a cell to represent a neuron synapse. Artificial neuromorphic processing is further configured to classify the visual imagery with analog memory and adder circuitry. The embedded artificial neuromorphic processing comprises a convolutional neural network (CNN) for sensing and classifying the visual imagery.

The embodiments of the present disclosure can achieve several technical effects, including machine learning, including classifying, with split gate flash MLC in NN. Devices formed in accordance with embodiments of the present disclosure enjoy utility in various industrial applications, e.g., microprocessors, flash drives, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including high density MRAMs, ReRAMs and FeRAMs in the advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   multi-level cell (MLC) split-gate flash memory formed over a substrate, wherein the MLC split-gate flash memory comprises:
   source/drain (S/D) region formed in the substrate;
   floating gate (FG) disposed over the substrate and S/D region;
   control gate (CG) disposed over the FG;
   select gate (SG) disposed over the substrate and adjacent to the FG and CG; and
   oxide layer separating the SG, FG and CG,
   the MLC split-gate flash memory embedded with artificial neuromorphic processing to:
   dynamically program and erase each cell of the MLC split-gate flash memory; and
   sense visual imagery by the artificial neuromorphic processing,
   wherein the embedded artificial neuromorphic processing comprises a convolutional neural network (CNN) for sensing and classifying the visual imagery.

2. The device according to claim 1, wherein the MLC split-gate flash memory comprises
   persistent memory on-chip.

3. The device according to claim 1, wherein the MLC split-gate flash memory further comprises MLC multiple states/bit within a predefined margin window.

4. The device according to claim 1, wherein artificial neuromorphic processing is further configured to classify the visual imagery with analog memory and adder circuitry.

5. The device according to claim 1, wherein the MLC split-gate flash memory is split into two bits per cells or four logical states of a same cell footprint.

6. The device according to claim 1, wherein the MLC split-gate flash memory is split into three bits per cells or eight logical states of a same cell footprint.

7. The device according to claim 1, wherein the MLC split-gate flash memory is split into four bits per cells or sixteen logical states of a same cell footprint.

8. A method comprising:
forming multi-level cell (MLC) split-gate flash memory over a substrate,
wherein the MLC split-gate flash memory comprises:
source/drain (S/D) region formed in the substrate;
floating gate (FG) disposed over the substrate and S/D region;
control gate (CG) disposed over the FG;
select gate (SG) disposed over the substrate and adjacent to the FG and CG; and
oxide layer separating the SG, FG and CG,
the MLC split-gate flash memory embedded with artificial neuromorphic processing;
dynamically programming and erasing each cell of the MLC split-gate flash memory; and
sensing visual imagery by the artificial neuromorphic processing,
wherein the embedded artificial neuromorphic processing comprises a convolutional neural network (CNN) for sensing and classifying the visual imagery.

9. The method according to claim 8, wherein the MLC split-gate flash memory comprises
persistent memory on-chip.

10. The method according to claim 8, comprising forming the MLC split-gate flash memory with multiple bits/states within a predefined margin window.

11. The method according to claim 8, wherein the artificial neuromorphic processing is further configured to classify the visual imagery with analog memory and adder circuitry.

12. The device according to claim 8, wherein forming the MLC split-gate flash memory comprises forming the MLC split-gate flash memory with two bits per cells or four logical states of a same cell footprint.

13. The device according to claim 8, wherein forming the MLC split-gate flash memory comprises forming the MLC split-gate flash memory with three bits per cells or eight logical states of a same cell footprint.

14. The device according to claim 8, wherein forming the MLC split-gate flash memory comprises forming the MLC split-gate flash memory with four bits per cells or sixteen logical states of a same cell footprint.

15. A method comprising:
forming multi-level cell (MLC) split-gate flash memory over a substrate,
wherein the MLC split-gate flash memory comprises:
source/drain (S/D) region formed in the substrate;
floating gate (FG) disposed over the substrate;
control gate (CG) disposed over the FG;
word line gate (WG) disposed over a drain region of the S/D region, and adjacent to the FG and CG; and
erase gate (EG) formed over a source region of the S/D region, and adjacent to the FG and CG,
the MLC split-gate flash memory comprises multiple bits/states within a predefined margin window and is embedded with artificial neuromorphic processing;
dynamically programming and erasing each cell of the MLC split-gate flash memory;
sensing visual imagery by the artificial neuromorphic processing; and
classifying the visual imagery with analog memory and adder circuitry,
wherein the embedded artificial neuromorphic processing comprises a convolutional neural network (CNN) for sensing and classifying the visual imagery.

16. The method according to claim 15, wherein forming the MLC split-gate flash memory comprises forming the MLC split-gate flash memory with two bits per cells or four logical states of a same cell footprint.

17. The method according to claim 15, wherein forming the MLC split-gate flash memory comprises forming the MLC split-gate flash memory with three bits per cells or eight logical states of a same cell footprint.

18. The method according to claim 15, wherein forming the MLC split-gate flash memory comprises forming the MLC split-gate flash memory with four bits per cells or sixteen logical states of a same cell footprint.

\* \* \* \* \*